US012750058B2

(12) United States Patent
Traversa

(10) Patent No.: US 12,750,058 B2
(45) Date of Patent: Sep. 29, 2026

(54) SYSTEM ON CHIP SELF-ORGANIZING GATES AND RELATED SELF ORGANIZING LOGIC GATES AND METHODS

(71) Applicant: MemComputing, Inc., San Diego, CA (US)

(72) Inventor: Fabio Lorenzo Traversa, San Diego, CA (US)

(73) Assignee: MemComputing, Inc., San Diego, CA (US)

(*) Notice: Subject to any disclaimer, the term of this patent is extended or adjusted under 35 U.S.C. 154(b) by 145 days.

(21) Appl. No.: 18/719,767

(22) PCT Filed: Dec. 22, 2022

(86) PCT No.: PCT/US2022/053781
§ 371 (c)(1),
(2) Date: Jun. 13, 2024

(87) PCT Pub. No.: WO2023/129466
PCT Pub. Date: Jul. 6, 2023

(65) Prior Publication Data

US 2025/0062767 A1 Feb. 20, 2025

Related U.S. Application Data

(60) Provisional application No. 63/294,270, filed on Dec. 28, 2021.

(51) Int. Cl.
*H03K 19/20* (2006.01)
*H03K 19/17704* (2020.01)

(52) U.S. Cl.
CPC ....... *H03K 19/20* (2013.01); *H03K 19/17704* (2013.01)

(58) Field of Classification Search
None
See application file for complete search history.

(56) References Cited

U.S. PATENT DOCUMENTS

| | | | |
|---|---|---|---|
| 3,950,733 | A | 4/1976 | Cooper et al. |
| 4,479,241 | A | 10/1984 | Buckley |
| 5,148,514 | A | 9/1992 | Arima et al. |
| 6,316,962 | B1 | 11/2001 | Kwon |

(Continued)

FOREIGN PATENT DOCUMENTS

| | | |
|---|---|---|
| KR | 10-2013-0080622 | 7/2013 |
| WO | WO 2006/073025 | 7/2006 |

OTHER PUBLICATIONS

International Search Report and Written Opinion received in PCT/US2022/053781 mailed Apr. 5, 2023.

(Continued)

*Primary Examiner* — Jany Richardson

(74) *Attorney, Agent, or Firm* — Knobbe, Martens, Olson & Bear, LLP

(57) ABSTRACT

System on chip self-organizing gates are provided. In one aspect, a self-organizing logic circuit includes a plurality of self-organizing logic gates and at least one control circuit configured to selectively connect the self-organizing logic gates to embed a problem in the self-organizing logic gates. The self-organizing logic circuit can further include an output circuit configured to read a solution to the problem from the self-organizing logic gates.

20 Claims, 9 Drawing Sheets

(56) References Cited

U.S. PATENT DOCUMENTS

| | | | | |
|---|---|---|---|---|
| 6,671,678 | B1 | 12/2003 | Wang | |
| 8,274,312 | B2 * | 9/2012 | Pino | G11C 13/0007 326/38 |
| 8,773,167 | B2 | 7/2014 | Robinett et al. | |
| 9,406,016 | B2 | 8/2016 | Pino et al. | |
| 9,911,080 | B2 | 3/2018 | Di Ventra et al. | |
| 11,165,430 | B1 | 11/2021 | Manipatruni et al. | |
| 12,468,925 | B2 | 11/2025 | Di Ventra et al. | |
| 2003/0058697 | A1 | 3/2003 | Tour et al. | |
| 2007/0176643 | A1 | 8/2007 | Nugent | |
| 2011/0106742 | A1 | 5/2011 | Pino | |
| 2012/0175583 | A1 | 7/2012 | Nugent | |
| 2012/0217995 | A1 | 8/2012 | Pino et al. | |
| 2014/0028347 | A1 | 1/2014 | Robinett et al. | |
| 2014/0156576 | A1 | 6/2014 | Nugent | |
| 2015/0019468 | A1 | 1/2015 | Nugent et al. | |
| 2017/0316309 | A1 * | 11/2017 | Di Ventra | G06G 7/122 |
| 2018/0144239 | A1 * | 5/2018 | Di Ventra | G06N 3/063 |
| 2021/0342681 | A1 | 11/2021 | Pershyn | |

OTHER PUBLICATIONS

Extended European Search Report received for EP App. No. 22917238.2 dated Feb. 17, 2026.

F. L. Traversa and M. Di Ventra, "MemComputing Integer Linear Programming," arXiv:1808.09999 (2018), http://arxiv.org/abs/1808.09999v1.

F. L. Traversa, et al., and M. Di Ventra, "Evidence of Exponential Speed-Up in the Solution of Hard Optimization Problems,"Complexity 2018, 1 (2018).

M. Di Ventra and F. L. Traversa, "Perspective: Memcomputing: Leveraging memory and physics to compute efficiently,"Journal of Applied Physics 123, 180901 (2018).

H. Manukian, et al., "Accelerating deep learning with memcomputing," Neural Networks 110, 1 (2019).

F. Sheldon, et al., "Stress-Testing Memcomputing on Hard Combinatorial Optimization Problems," IEEE Transactions on Neural Networks and Learning Systems, in press, DOI: 10.1109/tnnls.2019.2927480 (2019).

F. Sheldon, et al., "Taming a nonconvex landscape with dynamical long-range order: Memcomputing Ising benchmarks," Physical Review E 100 (2019), 10.1103/physreve.100.053311.

F. L. Traversa, "Aircraft Loading Optimization: MemComputing the 5th Airbus Problem " (2019), arXiv:1903.08189v2 [cs.ET].

M. Di Ventra, F. L. Traversa, and I. V. Ovchinnikov, "Topological Field Theory and Computing with Instantons," Ann. Phys. (Berlin), 1700123 (2017).

M. Di Ventra and F. L. Traversa, "Absence of chaos in digital memcomputing machines with solutions, "Phys. Lett. A 381, 3255 (2017).

M. Di Ventra and F. L. Traversa, "Polynomial-time solution of prime factorization and NP-complete problems with digital memcomputing machines," Physics Letters A, vol. 381, Issue 38, (2017).

M. Di Ventra and F. L. Traversa, "Absence of periodic orbits in digital memcomputing machines with solutions," Chaos: An Interdisciplinary Journal of Nonlinear Science 27, 101101 (2017).

S. R. Bearden, et al., "Instantons in Self-Organizing Logic Gates," Physical Review Applied 9 (2018).

S. Zbinden, et al.,, "Embedding Algorithms for Quantum Annealers with Chimera and Pegasus Connection Topologies," in High Performance Computing, edited by P. Sadayappan, et al. (Springer International Publishing, Cham, 2020), pp. 187-206.

A. Sua'rez, Stability analysis of nonlinear microwave circuits (Artech House, Boston, MA, 2003).

C.-W. Ho, et al., "The Modified Nodal Approach to Network Analysis," IEEE Transactions on Circuits and Systems 22, 504 (1975).

MemComputing Products, https://www.memcpu.com/products/, snapshot from Dec. 2021.

* cited by examiner

SYSTEM ON CHIP SELF-ORGANIZING GATES AND RELATED SELF ORGANIZING LOGIC GATES AND METHODS

CROSS REFERENCE TO ANY PRIORITY APPLICATIONS

The present application claims the benefit of priority of U.S. Provisional Patent Application No. 63/294,270, filed Dec. 28, 2021 and titled "SYSTEM ON CHIP SELF ORGANIZING GATES," the disclosure of which is hereby incorporated in its entirety and for all purposes.

TECHNICAL FIELD

The present disclosure relates generally to self-organizing gates. More particularly, the present disclosure is related to new self-organizing logic gates, systems and methods for self-organizing logic gates that can be arranged to solve combinatorial problems.

DESCRIPTION OF THE RELATED TECHNOLOGY

Standard or elemental logic gates have one or more input terminals and an output terminal that depends on the signal(s) applied to the input terminal(s). Such logic gates are designed to represent logical operators based on digital values applied to the input terminal(s). However, standard logic gates are not designed to enable signals to be applied at an output terminal to affect the state of the input terminal(s).

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect is a self-organizing logic circuit, comprising: a plurality of self-organizing logic gates; at least one control circuit configured to selectively connect the self-organizing logic gates to embed a problem in the self-organizing logic gates; and an output circuit configured to read a solution to the problem from the self-organizing logic gates.

In some embodiments, the at least one control circuit comprises: a plurality of address lines; a bit line selector; and a gate terminal selector, wherein the bit line selector and the gate terminal selector are configured to electrically connect the self-organizing logic gates via the address lines to embed the problem in the self-organizing logic gates.

In some embodiments, the at least one control circuit further comprises: a plurality of selectors, each of the selectors comprising: a switch configured to connect a terminal of a corresponding one of the self-organizing logic gates to one of the address lines representing a variable of the problem, and a latch configured to control the switch.

In some embodiments, each of the self-organizing logic gates comprises: a plurality of physical terminals, and a plurality dynamic correction circuits, each of the dynamic correction circuits configured to drive a state of one of the physical terminals based on a state of one or more other ones of the physical terminals.

In some embodiments, each of the dynamic correction circuits comprises a diode device and one or more elemental logic gates.

In some embodiments, the one or more elemental logic gates comprise: an elemental OR gate including: input terminals connected to each of the physical terminals other than the one of the physical terminals, and an output terminal connected to the one of the physical terminals, and an elemental NOT gate including: an input terminal coupled to the output terminal of the elemental OR gate, and an output terminal coupled to the diode device.

In some embodiments, the one or more elemental logic gates are configured to implement a NOR logic function such that an input signal to the diode device satisfies a NOR logic relationship with signals at each of the physical terminals other than the one of the physical terminals.

In some embodiments, the plurality of dynamic correction circuits of a particular self-organizing logic gate of the self-organizing logic gates are configured to implement a logical OR operation of the particular self-organizing logic gate such that at least one of the plurality of physical terminals of the particular self-organizing logic gate has a logic 1 state.

In some embodiments, the self-organizing logic gates comprise: a plurality of self-organizing OR gates, and a plurality of self-organizing NOT gates.

In some embodiments, the problem is a satisfiability problem.

In some embodiments, the self-organizing logic circuit is embodied on a single integrated circuit.

In some embodiments, the self-organizing logic gates consist of metal oxide semiconductor circuit elements.

Another aspect is a self-organizing logic gate, comprising: a plurality of physical terminals; and a plurality dynamic correction circuits, each of the dynamic correction circuits configured to drive a state of one of the plurality of physical terminals based on states of the remaining one or more physical terminals of the plurality of physical terminals, wherein the plurality of dynamic correction circuits are configured to implement a logical OR operation of the self-organizing logic gate such that at least one of the plurality of physical terminals has a logic 1 state.

In some embodiments, each of the dynamic correction circuits comprises a diode device and one or more elemental logic gates.

In some embodiments, the one or more elemental logic gates comprise: an elemental OR gate including: input terminals connected to each of the physical terminals other than the one of the physical terminals, and an output terminal connected to the one of the physical terminals, and an elemental NOT gate including: an input terminal coupled to the output terminal of the elemental OR gate, and an output terminal coupled to the diode device.

In some embodiments, the one or more elemental logic gates are configured to implement a NOR logic function such that an input signal to the diode device satisfies a NOR logic relationship with signals at each of the physical terminals other than the one of the physical terminals.

In some embodiments, self-organizing logic gate further comprises: a global feedback circuit configured to provide additional electrical energy to the plurality of physical terminals when the self-organizing logic gate is in an invalid state.

In some embodiments, the global feedback circuit comprises: a plurality of first diode devices, each of which includes an input coupled to a corresponding one of the plurality of physical terminals and an output, a capacitor including a first terminal coupled to each of the outputs of the plurality of first diode devices and a second terminal coupled to a voltage supply, a plurality of elemental NOT gates, each of which includes an input coupled to the first terminal of the capacitor and an output, and a plurality of second diode devices, each of which includes an input coupled to an output of a corresponding one of the plurality of element NOT gates and an output coupled to corresponding one of the plurality of physical terminals.

In some embodiments, the self-organizing logic gate consists of metal oxide semiconductor circuit elements.

Yet another aspect is a method of solving a satisfiability problem, comprising: embedding the satisfiability problem in a plurality of self-organizing logic gates by selectively connecting the self-organizing logic gates; and reading a solution to the satisfiability problem from the self-organizing logic gates once the self-organizing logic gates have reached an equilibrium.

In some embodiments, the plurality of self-organizing logic gates includes a plurality of self-organizing OR gates and a plurality of self-organizing NOT gates.

In some embodiments, the method further comprises embedding an other problem in at least some of the plurality of self-organizing logic gates; and reading a solution to the other problem from the self-organizing logic gates.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

DETAILED DESCRIPTION

Figure 1A:
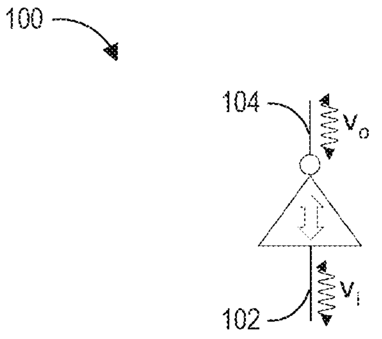
FIGS. 1A-1C illustrate symbols representing embodiments of self-organizing gates in accordance with aspects of this disclosure.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

Introduction to Self-Organizing Logic Gates

Aspects of this disclosure relate to systems and techniques for evaluating combinatorial problems (e.g., satisfiability (SAT) problems, maximum likelihood estimation (MLE) problems, etc.) using self-organizing gates (SOGs) as well as embodiments of SOGs that enable such systems. As described herein, SOGs can be used in circuits which are extremely efficient in solving combinatorial problems compared to traditional processors. For example, combinatorial problems can be useful in planning, scheduling, computer vision, artificial intelligence, large scale simulations, such as very large scale integration (VLSI) tools, and encryption, among other applications.

Standard logic gates (also referred to herein as "elemental logic gates") have one or more input terminals and an output terminal that depends on the signal(s) applied to the input terminal(s). Such logic gates are designed to represent logical operators based on digital values applied to the input terminal(s). However, standard logic gates are not designed to enable signals to be applied at an output terminal to affect the state of the input terminal(s). In contrast, in addition to the functionality of a standard logic gate, a self-organizing logic gate (SOLG) is also arranged to adjust the state(s) of signals at terminal(s) based on a signal applied at any terminal of the SOLG. Accordingly, each terminal of a SOLG can function as both an input terminal and an output terminal. When the states of signals at its terminals are invalid according to a SOLG's logic, the SOLG can be configured to adjust one or more of the signals at terminals until all of the signals at the terminals are in a logically valid and stable state.

Self-organizing logic gates are one example of more general self-organizing gates. As used herein, a SOG can generally refer to a deterministic dynamical system designed to have equilibrium points if and only if the variables (SOG states) are in a configuration that is consistent with a designed function (e.g., the SOG's logical operation). Similarly, SOLGs encode Boolean formulas such that a SOLG will have equilibrium point(s) if and only if the states of signals at the terminals of the SOLG (also referred to as variables) are in a configuration that is consistent with the encoded Boolean formula. The states of signals at terminals of a SOLG can be referred to as states of terminals of the SOLG.

As described herein, SOGs can be considered “terminal agnostic” devices. For example, any state variable of a SOG may be dynamically driven by both internal feedback of the SOG as well as coupling to other devices (e.g., SOG-SOG couplings). This property can be used to make “reverse logic” with SOGs. Reverse logic is one useful application for self-organizing logic that can be implemented with SOGs. More generally for a self-organizing circuit (SOC), the variables defined as inputs can be set and SOC dynamics can be allowed to find the equilibria common to all SOGs. In this way, SOCs can be programmed or embedded with problems (e.g., SAT problems, MLE problems, etc.) and the equilibria the SOC reaches will map to the solutions of these problems.

One design aspect to be considered for an SOC is to design the SOC so that it converges to the wanted equilibria rapidly. This can be accomplished through feedback mechanisms that do not allow equilibria other than the equilibria that are consistent with the SOG functions. The convergence to such equilibria can also be accelerated by designing the system such that the variables of the SOC have highly correlated dynamics that, de facto, establish non-local correlations that accelerate the convergence to the equilibria.

Aspects of this disclosure relate to the design of SOGs and SOCs using standard electronic devices. In some embodiments, the SOC design can be made using complementary metal oxide semiconductor (CMOS) technology that offers design flexibility, high scalability, and integrability and is both easy to productize and deploy in the field. SOLGs disclosed herein can be manufactured using process technology for fabricating transistors, such as field effect transistors (e.g., metal oxide semiconductor transistors). Such process technology can also be used to manufacture passive impedance elements, such as capacitors, inductors, resistors, diodes, or any suitable combination thereof. SOCs disclosed herein can each be embodied on a single chip. Embodiments of this disclosure further relate to self-organizing logic gates that can be used as the building blocks of a hardware SOC solution.

Self-Organizing Circuit Design

Aspects of this disclosure relate to hardware systems that can solve combinatorial problems (format examples are: SAT, MLE, max-fault min-cardinality (MFMC), and mixed-integer linear programming (MILP)) using a SOC designed using SOGs as building blocks. Certain embodiments may implement a modular approach for the SOC design. In certain implementations, the SOGs can include a combination of three terminal SO-OR gates and two terminal SO-NOT gates. This can enable the direct implementation of any SAT and maximum SAT (MaxSAT) problem in conjunctive normal as discussed herein. Some other embodiments can include additional building blocks, such as self-organizing binary adders that can be used to handle problems such as MILP more efficiently.

Aspects of this disclosure relate to a design for SOGs, which can include a design for each SOG type (e.g., OR, NOT, binary adder, etc.) by testing several MOS-technology based variants of a SOG design using computer aided design (CAD). The design criteria for the SOG can include: i) achieving reliable analog feedback circuitry internal to SOGs to induce and control the dynamics when an SOG state is not consistent with the wanted logic function (e.g., OR, NOT, etc.). These feedback systems are generally referred to as dynamic correction circuits or “dynamic correction modules” (DCMs) and can play a role for embodiments of the described technology. The design criteria for the SOGs can include ii) ensuring the working principle for isolated (e.g., not coupled) SOGs is possible under any external input configuration, and iii) ensuring the working principle for any coupled SOG-SOG interactions are allowed by the interconnect system.

Embodiments also relate to compact (e.g., a low number of transistors) designs that meet all of the above design criteria so that the system handles millions of variables and millions of SOGs on a single chip. Some embodiments relate to a behavioral/compact model of the SOG to be implemented in the system level simulation.

Further embodiments relate to the design of an interconnect system and a logic control module. Self-organizing circuits (SOCs) are integrated electronic circuits where multiple SOGs are placed on the same chip, and a hierarchy of interconnects can be programmed and reprogrammed (similar to field programmable gate arrays (FPGAs)) to couple terminals from different SOGs. Reprogramming the interconnects allows for the flexibility to implement different solutions to sets of unique problems. This reprogramming capability can ensure minimal embedded preprocessing and “ancilla variables”. Aspects of this disclosure relate to a design that includes: i) a proper interconnect hierarchy system which may include variants of this depending on the problem classes (SAT, MLE, etc.) for efficient embedding, ii) logic control modules to physically program the interconnects, and iii) a hardware description language to command the logic control modules.

Still further aspects relate to a printed circuit board (PCB) design and test platform. The PCB design can be used for interfacing the input data from the user (e.g., the problem) with the SOC. Input data can be converted into voltages set at the appropriate nodes of the SOC.

Certain embodiments also relate to a system level simulator. Together with the application specific integrated circuit (ASIC) design, a system level simulator can allow analysis of the behavioral/compact models of the SOGs. The simulator helps determine the qualitative and, up to an extent, quantitative behavior of large SOCs (a full CAD simulation might be prohibitive) and help in the design of the final product. The simulator can be used as a tool to predict the performance of the hardware when solving problems. It may predict the collective phenomena in SOCs to ensure that criticality and long-range correlations have been correctly established.

Self-Organizing Logic Gate Design

Further aspects of this disclosure relate to the design of the building blocks of self-organizing logic gates (SOLGs) which can be used to implement a SOC as described herein. Some of the terminology used in this disclosure about dynamical systems, coupling, etc. may be reinterpreted in a circuit theory framework. This may allow a clearer explanation the design and provides a straightforward proof of feasibility in metal oxide semiconductor (MOS) technology without further remapping. For the sake of completeness, since any electronic circuit is described by a system of differential equations, it implies that any electronic circuit is an embodiment of a dynamical system.

The term “digital circuit” can be used to describe an approximation of an electronic circuit where only certain voltage states are considered. For example, voltages above or below a given threshold can be interpreted as logical states. However, a more full and complete description of an electronic circuit is as an analog system. The description of the circuits described herein, where implicit, should be always considered full, but at the same time aspects of this disclosure consider and leverage information encoded through thresholds (e.g., digital interpretation using a predefined threshold). Therefore, those skilled in the art will recognize that the SOGs described herein are electronic circuits (and thus dynamical systems) performing computation through their analog nature while encoding information through thresholds designed to avoid information encoding and decoding precision issues.

Figure 1B:
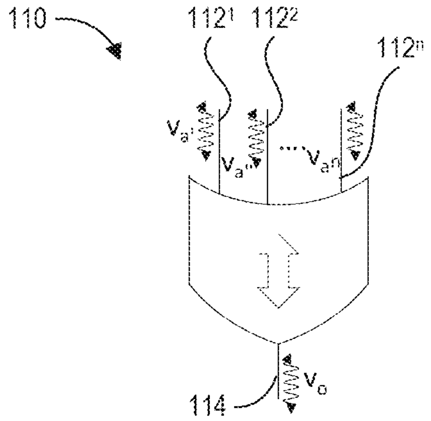
Figure 1C:
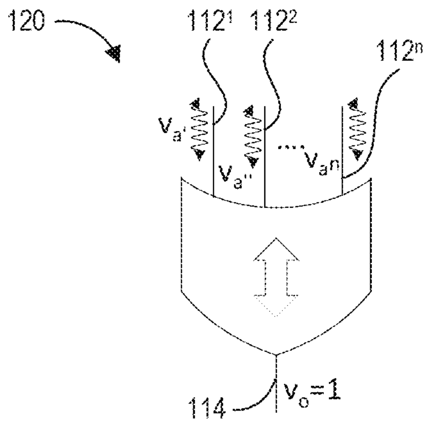

FIGS. 1A-1C illustrate symbols representing embodiments of self-organizing gates in accordance with aspects of this disclosure. In particular, FIG. 1A illustrates a SO-NOT gate, FIG. 1B illustrates a first embodiment of a SO-OR gate, and FIG. 1C illustrates a second embodiment of a SO-OR gate. While embodiments of SO-NOT and SO-OR gates are provided, it will be understood that any other logic gates (e.g., AND, XOR, NAND, NOR, XNOR, etc.) can be implemented as SOLGs. Moreover, in some embodiments an SOLG can implement any suitable binary operation, such as binary addition, binary subtraction, a logic operation, etc.

With reference to FIG. 1A, the SO-NOT gate 100 includes two terminals including a first terminal 102 and a second terminal 104. The SO-NOT gate 100 is illustrated using a symbol similar to the traditional NOT symbol with the inclusion of a double arrow to distinguish from the traditional NOT symbol. Since the SO-NOT gate 100 is a SOLG, the SO-NOT gate does not have an input and an output in the traditional sense. That is, the state $v_i$ of the first terminal 102 can affect the state $v_o$ of the second terminal 104 and the state $v_o$ of the second terminal 104 can also affect the state $v_i$ of the first terminal 102. Thus, the SO-NOT gate 100 does not necessarily have a directionality in which the SO-NOT gate 100 applies the logical NOT operation.

The SO-OR gate 110 of FIG. 1B includes a plurality of first terminals $\mathbf{112}^1$-$\mathbf{112}^n$ and a second terminal 114. Similar to the SO-NOT gate 100, since the SO-OR gate 110 is implemented as a SOLG, the states $v_{a1}$-$v_{an}$ of the first terminals $\mathbf{112}^1$-$\mathbf{112}^n$ can affect the state $v_o$ of the second terminal 114 and the state $v_o$ of the second terminal 114 can also affect the states $v_{a1}$-$v_{an}$ of the first terminals $\mathbf{112}^1$-$\mathbf{112}^n$. Thus, the SO-OR gate 110 does not necessarily have a directionality in which the SO-OR gate 110 implements the logical OR operation. The SO-OR gate 110 implements a logic function where the signal at the second terminal 114 is the logical OR of the signals at the first terminals $\mathbf{112}^1$-$\mathbf{112}^n$ in a stable state.

In FIG. 1C, the illustrated SO-OR gate 120 is an embodiment of the SO-OR gate 110 of FIG. 1B that has been simplified for use in solving satisfiability problems in conjunctive normal form. For example, the second terminal 114 of the SO-OR gate 120 can be set to a state $v_o$ of "one", which can represent a solution to a satisfiability problem. The SO-OR gate 120 implements a logic function where the OR of the signals at the first terminals $\mathbf{112}^1$-$\mathbf{112}^n$ is logic 1 in a stable state. Accordingly, the SO-OR gate 120 functions such that at least one signal at a respective terminal the first terminals $\mathbf{112}^1$-$\mathbf{112}^n$ is logic one in the stable state.

As used herein, a satisfiability problem in conjunctive normal form generally refers to a collection of clauses where the goal of the problem is to find a variable assignment that satisfies all of the clauses. Each clause may be logically equivalent to and thus implemented in hardware by an OR gate with a number of inputs variables (e.g., implemented by the terminals of the OR gate) equal to the number of literals (e.g., variables or negations of variables) appearing in the clause. Thus, any satisfiability problem can be fully represented via a combination of multi-terminal OR and NOT gates. In addition, logical OR and NOT operations can be used as a complete basis for any computable function, and thus, aspects of this disclosure can also be expanded to implement any function. However, certain functions (e.g., satisfiability problems) may be executed significantly faster using the SOCs described herein than using traditional processors.

In FIGS. 1A-1C the symbols used for SO OR and NOT gates 100, 110, 120 include an internal double-way arrow to indicate that these gates can accept a superposition of (voltage/current) signals driven by the SOLG and driven external to the SOLG at each terminal. As used herein, the term "superposition" generally refers to the classical superposition of signals in an electromagnetic field. As described herein, the circuits implementing the SO OR and NOT gates 100, 110, 120 can create internal feedback that drives the states at the respective terminals in a configuration consistent with the Boolean operations they implement. For example, the SO-NOT gate 100 can create internal feedback to bring the terminal states to be at the opposite values. The SO-OR gate 110 or 120 can create internal feedback to make the output consistent with the inputs and vice-versa, at the same time. These properties allow the use of SOLGs in a completely different way with respect to standard logic gates to solve problems.

The SO-OR gates 110 and 120 are dynamical systems with at least three variables x,y,z encoding logic 0 and 1 through a threshold. For example, a voltage above the threshold may represent logic 1 and a voltage below the threshold may represent logic 0. In some embodiments, the threshold voltage may be 0.5 V. However, other threshold voltages are also possible depending on the implementation.

Due to its internal logic, the SO-OR gate 110 will be in equilibrium if and only if (x>th) OR (y>th)=(z>th), where th is a given threshold. If the variables do not satisfy the OR relation (e.g., the SO-OR gate 110 is in an invalid state), internal feedback of the SO-OR gate 110 will induce dynamics that can alter the state of at least one of the variables until the SO-OR gate 110 reaches a valid state. In certain embodiments, the SOGs described herein are modular and can be coupled together to form a network. A network of SOGs is generally referred to herein as a self-organizing circuit (SOC). A SOC can reach equilibrium when the equilibrium is reach for the configurations of variables that satisfy all SOGs simultaneously. In other words, when every SOG forming a SOC is in equilibrium, the SOC can also be considered in equilibrium.

When used in a SAT problem, the SO-OR gate 120 can have the variable z set to a fixed value (e.g., one) and the internal feedback of the SO-OR gate 120 will find a state for x and y such that (x>th) OR (y>th)=(z>th)=1.

Figure 2:
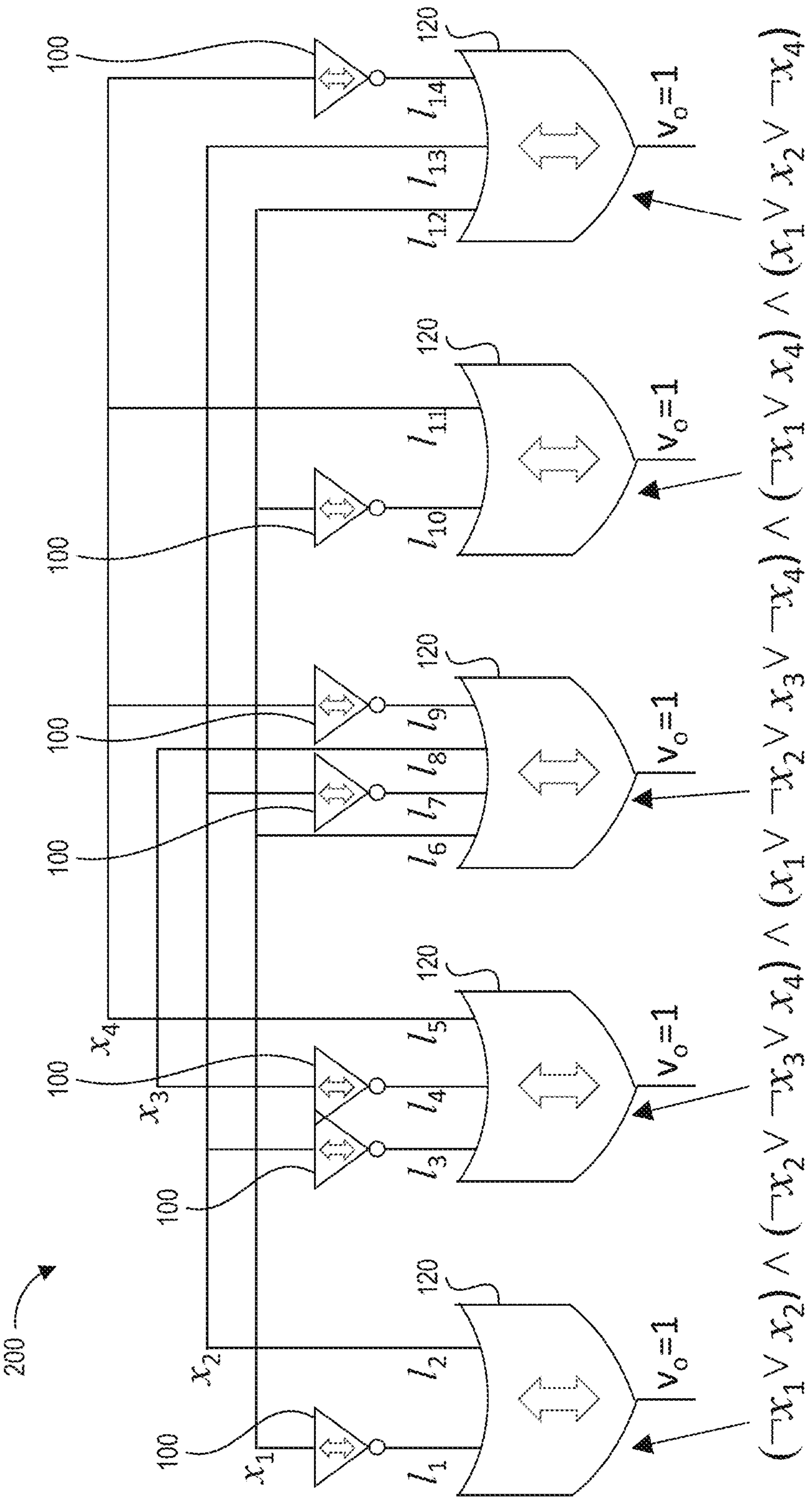
FIG. 2 is a schematic diagram of a circuit arranged to solve a satisfiability (SAT) problem with a combination of self-organizing logic gates (SOLGs) in accordance with aspects of this disclosure.

FIG. 2 is a schematic diagram of a circuit arranged to solve a SAT problem with a combination of SOLGs in accordance with aspects of this disclosure. A self-organizing logic circuit 200 of FIG. 2 includes SO-OR gates 120 and SO-NOT gates 100 arranged to solve a SAT problem. In particular, FIG. 2 implements the following example SAT problem:

$$(\bar{x}_1 \vee x_2) \wedge (\bar{x}_2 \vee \bar{x}_3 \vee x_4) \wedge (x_1 \vee \bar{x}_2 \vee x_3 \vee \bar{x}_4) \wedge (\bar{x}_1 \vee x_4) \wedge (x_1 \vee x_2 \vee \bar{x}_4).$$

In the above SAT problem, each clause is a disjunction of literals, where $\vee$ represents OR and $\wedge$ represents AND.

Accordingly, each of clause can be represented with a multi-terminal SO-OR gate 120 coupled with a SO-NOT gate 100 at the terminal(s) of the SO-OR gate 120 associated with the negated variables. In addition, if two clauses share a variable, the corresponding terminals in the SOC can be connected to the same variable rail as shown in FIG. 2.

When implementing a SAT problem, the SOC can solve the SAT problem by finding the variable assignments that satisfy all clauses in the SAT problem. When implemented by a combination of SOLGs, the SAT problem can be solved by finding the first terminal states that result in the second terminals of all of the SO-OR gates 120 being true (logic 1).

Solving problems of this format cannot be achieved using standard or elemental logic gates in this way, since standard logic gates cannot work in "reverse" mode. For example, setting the output terminal of a standard logic gate to some state does not affect the input terminals of the standard logic gate, and thus, the input terminals will not necessarily reach a state consistent with the output set to the standard logic gate.

On the contrary, SOLCs can be arranged to provide this functionality as described herein. With this in mind, the SO-OR gates 120 can be specialized for a satisfiability problems by assuming the output terminal is always set to true (see FIG. 1C). In other words, the SO-OR gate 120 can be designed with internal feedback that satisfies the logical OR operation with the output state set to true.

Accordingly, the SOC can be designed to solve any satisfiability problem via a combination of SO-OR gates 120 and SO-NOT gates 100 that map to the desired problem. The SAT problem can then be solved by allowing the internal feedback of each of the SO-OR gates 120 and SO-NOT gates 100 to generate currents and voltages that arrive at an equilibrium where the internal feedback is no longer driving a change in state for all gates 100 and 120 in the SOC. When the self-organizing logic circuit 200 is at equilibrium, the logic functions associated with each of the SO-OR gates 120 and each of the SO-NOT gates 100 is satisfied. At equilibrium, all of the gates 100 and 120 are in a consistent configuration and the variable assignment can be read at the variable rails to obtain a solution to the SAT problem.

Figure 3:
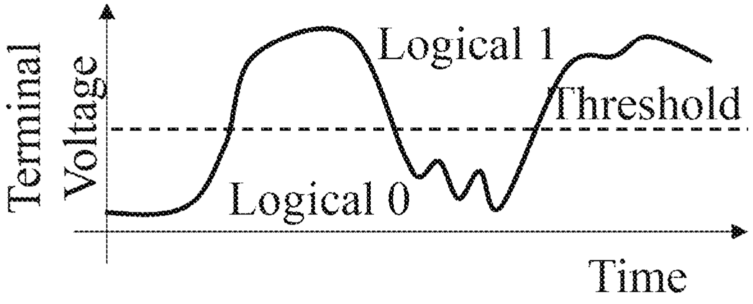
FIG. 3 is a graph illustrating dynamics of a SOLG in accordance with aspects of this disclosure.

FIG. 3 is a graph illustrating dynamics of a SOLG in accordance with aspects of this disclosure. The dynamics of a SOLG can be described by a differential algebraic equation (DAE) derived using modified nodal analysis. However, the information represented by terminals of a SOLG are encoded through thresholds.

SOLG design can involve the consideration of many different aspects of the integrated circuit field. These considerations can include but are not limited to the considerations described herein. In certain aspects, the design and understanding of the working principle of SOLGs involve the consideration of the full description of the dynamics of voltages and currents. A significant framework we can use to both simulate and analytically predict is the modified nodal analysis (MNA). The MNA allows to recast the description of integrated circuits in a set of DAE of the form:

$$\frac{dq(v, i)}{dt} = f(v, i, t)$$

In this equation, v, i and t are voltage at nodes, current at terminals, and the time respectively. q and f are nonlinear vector fields. The solution of this DAE can provide a full description of the state variable dynamics and is a dynamical system. Accordingly, tools can be used from the functional analysis, topology, and others to predict and design behavior of SOLGs.

According to aspects of this disclosure, SOLGs can be designed using circuit design and the DAE description such that the SOLGs reach equilibria, (e.g., values of v and i such that dq(v,i)/dt=0) if and only if a SOLG is in a "consistent state". The concept of state depends on how the state of a terminal or node is defined. While a full description of the terminal/terminal state involves the knowledge of i(t) and v(t), as used herein a "consistent state" generally refers to a consistent state in digital sense in which the logical states of terminals/nodes are determined with respect to a threshold as depicted in FIG. 3 and therefore a consistent state of a SOLG is defined by a truth table of the associated Boolean function. For example, the SO-NOT gate 100 will not be in a consistent configuration if its terminals are either both above (e.g., true) or both below (e.g., false) the threshold. When the SO-NOT gate 100 is in neither of the above-described states, the SO-NOT gate 100 is in a consistent configuration.

As described herein, a SOLG and/or SOC is designed to have self-organizing dynamics in which the ability of a single SOLG as well as a network of SOLGs (SOC) can reach equilibria associated with consistent states for all SOLGs at the same time (absence of local minima or spurious oscillations). To achieve self-organizing dynamics, aspects of this disclosure relate to SOLGs that include the use of dynamic correction circuits (also referred to as dynamic correction modules (DCMs)) and global feedback circuits (also referred to as global feedback modules with memory (GFMMs)). The dynamic correction circuits and global feedback circuits can both be used as feedback systems to drive a SOLG toward a consistent state.

Figure 4A:
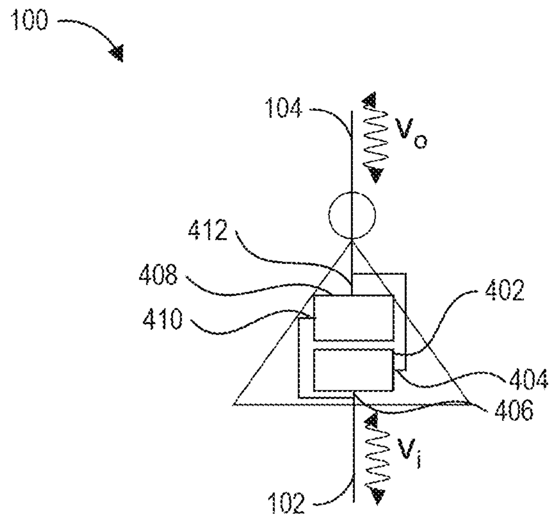
FIG. 4A illustrates an example embodiment of a self-organizing NOT (SO-NOT) gate including dynamic correction circuits in accordance with aspects of this disclosure.
Figure 4B:
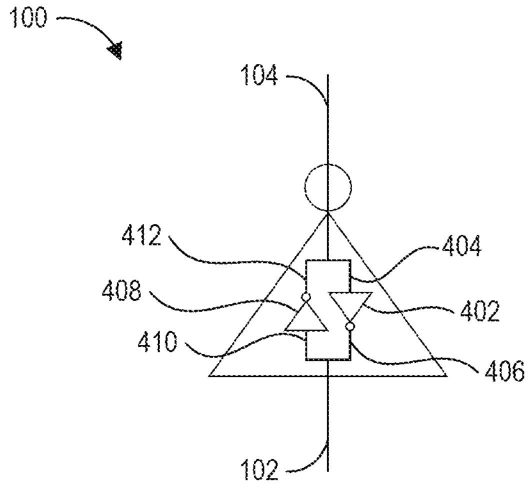
FIG. 4B illustrates an example embodiment of a SO-NOT gate including an embodiment of dynamic correction circuits in accordance with aspects of this disclosure.

FIG. 4A illustrates an example embodiment of a SO-NOT gate 100 including dynamic correction circuits in accordance with aspects of this disclosure. FIG. 4B illustrates an example embodiment of a SO-NOT gate 100 including an embodiment of dynamic correction circuits in accordance with aspects of this disclosure.

As shown in FIG. 4A, the SO-NOT gate 100 includes a first terminal 102, a second terminal 104, a first dynamic correction circuit 402, and a second dynamic correction circuit 408. The first dynamic correction circuit 402 has an input 404 coupled to the second terminal 104 and an output 406 configured to drive the first terminal 102. The second dynamic correction circuit 408 has an input 410 coupled to the first terminal 102 and an output 412 configured to drive the second terminal 104. With reference to FIG. 4B, the first and second dynamic correction circuits 402 and 408 can be embodied as elemental NOT gates 402 and 408. In some embodiments, the SO-NOT gate 100 can be fully integrated in MOS technology, although other fabrication techniques can also be used in some other embodiments.

The dynamic correction circuits 402 and 408 are configured to provide internal feedback within the SO-NOT gate 100 such that the states of the first terminal 102 and the second terminal 104 are driven to different values. The SO-NOT gate 100 can change state in response to a signal applied to the first terminal 102 and/or the second terminal 104.

Figure 5A:
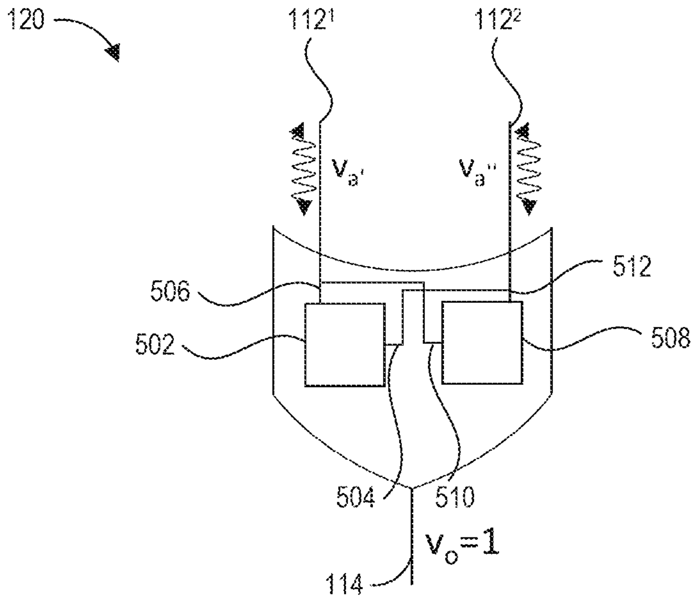
FIG. 5A illustrates an example embodiment of a self-organizing OR (SO-OR) gate configured to implement an OR function of two signals and including dynamic correction circuits in accordance with aspects of this disclosure.
Figure 5B:
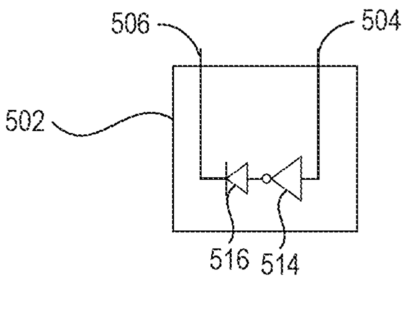
FIG. 5B illustrates an example embodiment of a dynamic correction circuit for the SO-OR gate of FIG. 5A in accordance with aspects of this disclosure.

FIG. 5A illustrates an example embodiment of a SO-OR gate 120 having two configured to implement an OR function of two signals and including dynamic correction circuits in accordance with aspects of this disclosure. FIG. 5B illustrates an example embodiment of a dynamic correction circuit for the SO-OR gate 120 of FIG. 5A in accordance with aspects of this disclosure.

As shown in FIG. 5A, the SO-OR gate 120 includes a first terminals 112[1] and 112[2], a second terminal 114, a first dynamic correction circuit 502, and a second dynamic correction circuit 508. The first dynamic correction circuit 502 has an input 504 coupled to the second terminal 112[2] and an output 506 configured to drive the first terminal 112[1]. The second dynamic correction circuit 508 has an input 510 coupled to the first terminal 112[1] and an output 512 configured to drive the second terminal 112[2].

With reference to FIG. 5B, the first dynamic correction circuit 502 includes an elemental NOT gate 514 and a diode device 516. The diode device 516 can be any suitable circuitry that implements functionality of a diode, such as a diode or a diode connected transistor. The second dynamic circuit 508 may have substantially the same structure as the first dynamic correction circuit 502. In some embodiments, the SO-OR gate 110 can be fully integrated in MOS technology, although other fabrication techniques can also be used in other embodiments.

The SO-OR gate 120 can implement a logical function where the OR of signals present at terminals 112[1] and 112[2] is true or set to logical 1. The SO-OR gate 120 can be included in a self-organizing circuit that solves a SAT problem. Since the SO-OR gate 120 is designed for use in solving SAT problems, a physical second terminal 114 is not required since the second terminal 114 is logically set to true. Accordingly, the first and second dynamic correction circuits 502 and 508 are not connected to the second terminal 114 in FIGS. 5A and 5B. The SO-OR gate 120 can be implemented with only two physical terminals 112[1] and 112[2]. The SO-OR gate 120 of FIG. 5A implements a logic function where the OR of the signals at the first terminals 112[1], 112[2] is logic 1 in a stable state. Accordingly, the SO-OR gate 120 functions such that at least one of the first terminals 112[1], 112[2] is logic 1 in the stable state.

Figure 6A:
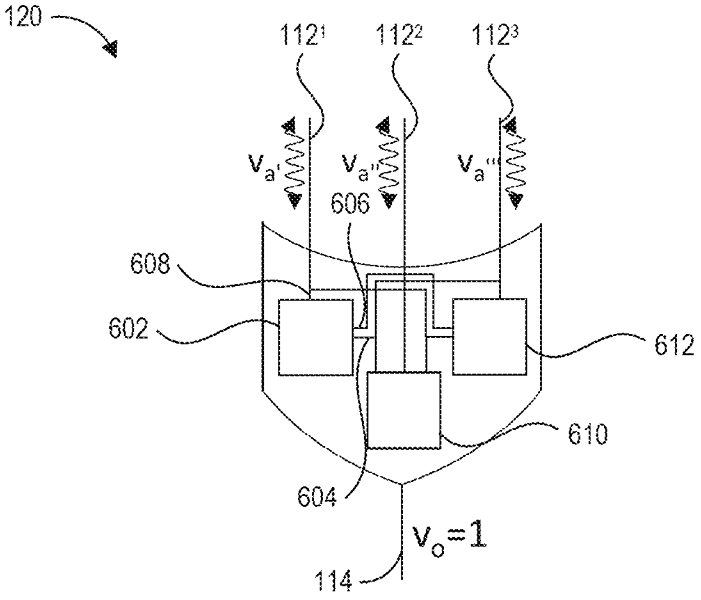
FIG. 6A illustrates an example embodiment of a SO-OR gate configured to implement an OR function of three signals and including dynamic correction circuits in accordance with aspects of this disclosure.
Figure 6B:
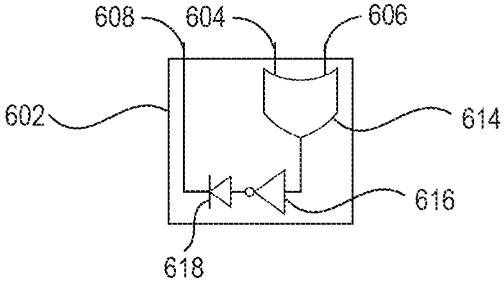
FIG. 6B illustrates an example embodiment of a dynamic correction circuit for the SO-OR gate of FIG. 6A in accordance with aspects of this disclosure.

FIG. 6A illustrates an example embodiment of a SO-OR gate 120 for implementing an OR function for three variables and including dynamic correction circuits in accordance with aspects of this disclosure. FIG. 6B illustrates an example embodiment of a dynamic correction circuit for the SO-OR gate 120 of FIG. 6A in accordance with aspects of this disclosure. The SO-OR gate 120 of FIG. 6A may be similar to the SO-OR gate 120 of FIG. 5A except that the SO-OR gate is modified to implement an OR function for 3 variables.

As shown in FIG. 6A, the SO-OR gate 120 includes a set of first terminals 112[1], 112[2], 112[3], a second terminal 114, and three dynamic correction circuits 602, 610, and 612. Since the dynamic correction circuits 602, 610, and 612 are similar, a description of a first one of the dynamic correction circuits 602 will be provided in detail for illustrative purposes. The dynamic correction circuit 602 has a first input 604 coupled to the terminal 112[3], a second input 606 coupled to the terminal 112[2], and an output 608 configured to drive the terminal 112[1].

With reference to FIG. 6B, the dynamic correction circuit 602 includes an elemental OR gate 614, an elemental NOT gate 616, and a diode device 618. The diode device 618 can be any suitable circuitry that implements functionality of a diode, such as a diode or a diode connected transistor. The elemental OR gate is coupled to the terminal 112[3] and the terminal 112[2] and is configured to output a true value when the terminal 112[3] and/or the terminal 112[2] has a true value state (e.g., is higher than the threshold voltage). When the output of the elemental OR gate 614 is true, the elemental NOT gate 616 outputs a false value to the diode device 618, which in turn allows the terminal 112[1] to float. Conversely, when the output of the elemental OR gate 614 is false (e.g., signals present at both of the terminals 112[2] and 112[3] are false), the elemental NOT gate 616 outputs a true value to the diode device 618, which in turn drives the terminal 112[1] toward true. In some embodiments, the elemental OR gate 614 can be implemented using only a few MOS transistors when designed in CMOS technology. In certain implementations, the elemental OR gate 614 and the elemental NOT gate 616 can be implemented together in MOS technology for a more compact design. For example, the elemental OR gate 614 and the elemental NOT gate 616 can be implemented as a NOR gate of CMOS transistors. In addition, diode devices can be relatively easy to create in MOS technology, and depending on the working point, can be formed with one or only a few MOS transistors.

The signal present at terminal 112[1] can affect the states of the signals at terminals 112[2] and 112[3] via the other two dynamic correction circuits 610 and 612. In addition, the diode device 618 functions to prevent the elemental not gate 616 from affecting the state of the terminal 112[1] when the output of the elemental not gate 616 is logic zero. The other two dynamic correction circuits 610 and 612 may have substantially the same structure and function as the dynamic correction circuit 602, except being connected differently to the first terminals 112[1], 112[2], and 112[3].

In some embodiments, the SO-OR gate 120 can be fully integrated in MOS technology. Other fabrication techniques can alternatively or additionally be used in other embodiments.

Since the SO-OR gate 120 is designed for use in solving SAT problems, a physical second terminal 114 is not required since the second terminal 114 is logically set to true. Accordingly, the dynamic correction circuits 602, 610, and 612 may not be connected to the second terminal 114, for example, as illustrated in FIG. 6A.

In summary, the dynamic correction circuits 602, 610, and 612 are arranged such that the if the SO-OR gate 120 is in a valid state (e.g., at least one of the terminals 112[1]-112[3] has voltage above the predefined threshold) then the SO-OR gate 120 is in a stable equilibrium. The SO-OR gate 120 of FIG. 6A implements a logic function where the OR of the signals at the first terminals 112[1], 112[2], 112[3] is logic 1 in a stable state.

In certain implementations, for example, as illustrated in FIGS. 4A-6B, dynamic correction circuits can be configured to receive inputs from all but one physical terminal of a SOLG and return an output to the remaining physical terminal of the SOLG. Dynamic correction circuits can be configured to generate outputs that are asynchronous with other dynamic correction circuits in the same and/or other SOLGs. The outputs generated by the dynamic correction circuits in a given SOLG can create an internal feedback loop inside the SOLG. For example, the dynamic correction circuits 402 and 408 of FIG. 4B form a bi-stable circuit with two equilibria, each with opposite states at the terminals 102 and 104 of the SO-NOT gate 100.

In addition to having stable equilibria, it is also desirable that a SOLG is capable of receiving a superposition of signals coming from a connected network (and the internal loop as feedback to these signals) trying to change the state of the terminals of the SOLG. This enables the SOLG to form part of a SOC such that the SOLG will change its state based on the received signals and apply signals back to the network that reflect the logical operation of the SOLG.

Due to the asynchronous design of the SO-NOT gate 100 and its dynamic correction circuits 402 and 408, it may not be possible to determine the temporal sequence in which the dynamic correction circuits 402 and 408 operate. In addition, fixing a convention may not be guaranteed in any hardware implementation of the SO-NOT gate 100. Additionally, instantaneous switching in feedback systems such as the SO-NOT gate 100 can lead to spurious oscillations, therefore equilibria may not be reached. A MOS implementation of a SOLG such as the SO-NOT gate 100 can be designed to overcome issues related to MOS-based NOT gates not typically being designed to receive incoming signals at the output terminal.

A standard CMOS implementation of a NOT gate may have currents spikes while receiving incoming signals to the output terminals before the coupled NOT gates can switch. This can ultimately damage the circuit if not controlled properly. Accordingly, in certain embodiments of this disclosure, the impedance at the output of the elemental NOT gate is designed to suppress and/or avoid such current spikes. This impedance can also at least partially provide the dynamics in between the two stable states of the SO-NOT gate 100. In addition, the impedance can therefore even create an avalanche phenomena in a SOC (e.g., a cluster of SOLGs that change states almost synchronously), which can be a significant aspect to implementing a SOC that will arrive at a stable state. Therefore, embodiments of this disclosure involve SO-NOT gates 100 having an impedance that accounts for the output impedance of elemental NOT gates. Examples of impedance systems that can be used to accomplish current peak mitigation are open collectors, or specific to MOS technology, open-drain connections.

The above discussion regarding the design of the SO-NOT gates 100 can also apply similarly to the SO-OR gates 120. For a more generalize n terminal SO-OR gate 120, the dynamic correction circuits of the SO-OR gate 120 can be generalized by replacing the element OR gate 614 with an n−1 terminal elemental OR gate, and the rest of the dynamic correction circuits components can be maintained similarly to as shown in FIG. 6B. Similar to the 3 terminal SO-OR gate 120 of FIGS. 6A and 6B, an n-terminal SO-OR gate has $2^n-1$ stable equilibria corresponding to all possible consistent states. However, when all terminals are in the false state, the dynamic correction circuits can drive at least one of the terminals to true because of the feedback from the other terminals.

Similarly to the SO-NOT gate 100, the design of the SO-OR gate 120 can create analogous issues when included in a network of SOLGs. For example, if one of the elemental NOT gates 616 has an input set to true, the diode device 618 may act as a short circuit, and incoming signals from the SOC can create structural issues. To address this potential problem, in some embodiments, the NOT gates 616 are designed with an output impedance to mitigate and/or prevent the incoming signals from generating structural issues via the upstream elemental OR gate 614. In some cases, the output impedance of the NOT gates 616 may be selected based on a model of the diode device and/or the other elements of the dynamic correction circuit 602 that impact the dynamics of the SO-OR gates 120 within an SOC.

While selecting the proper impedance for the elemental gates (e.g., NOT and/or OR gates) forming SOLGs can be significant as discussed above, these impedance values may have certain drawbacks when the SOLGs are connected to form an SOC. For example, while the impedance within a SOLG can help with current spikes and damping spurious oscillations, the impedance can create local minima for the SOC system. A local minimum may form, for example, when a SOLG is connected to two or more portions of an SOC that are imposing an invalid state on the SOLG. In certain conditions, the SOLG may not have sufficient energy to overcome any of the states imposed on the SOLG by the SOC portions, particularly when the connected portions are formed of a large number of SOLGs in respective stable states.

Figure 7A:
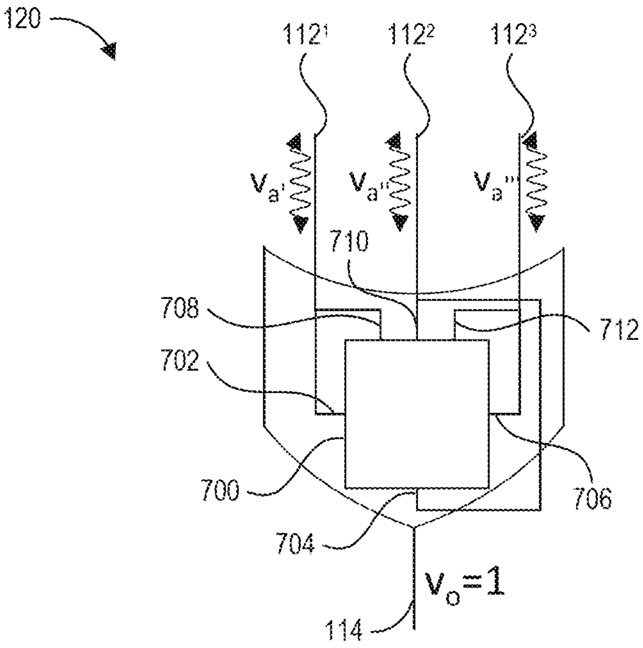
FIGS. 7A and 7B illustrate an SO-OR gate including a global feedback circuit in accordance with aspects of this disclosure.
Figure 7B:
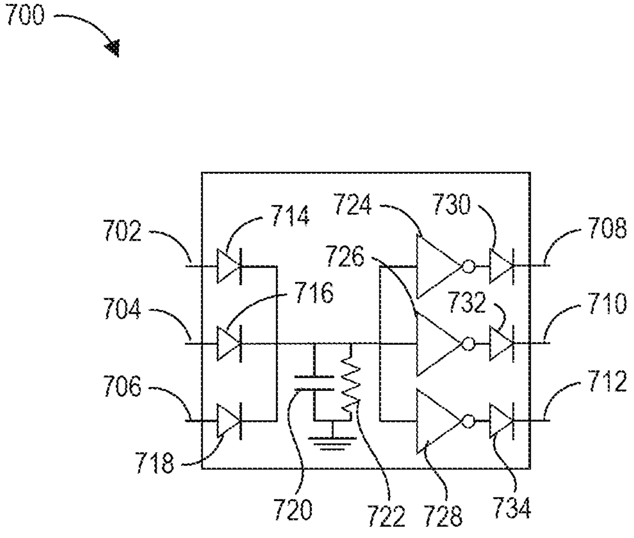

Thus, aspects of this disclosure further relate to the inclusion of a reinforcement mechanism which can be included in SOLGs to overcome this issue and/or other issues. FIGS. 7A and 7B illustrate an SO-OR gate 120 including a global feedback circuit (also referred to as a global feedback module with memory (GFMM)) in accordance with aspects of this disclosure. In particular, FIG. 7A illustrates a SO-OR gate 120 including a global feedback circuit 700 and FIG. 7B illustrates an embodiment of the global feedback circuit 700. Although FIG. 7A does not illustrate the dynamic correction circuits 602, 610, and 612, the dynamic correction circuits 602, 610, and 612 are present in the SO-OR gate 120 of FIG. 7A in addition to the global feedback circuit 700.

With reference to FIG. 7A, the global feedback circuit 700 includes three inputs 702, 704, and 706 each respectively coupled to one of the first terminals $\mathbf{112}^1$-$\mathbf{112}^3$ and three outputs 708, 710, and 712 each respectively coupled to one of the first terminals $\mathbf{112}^1$-$\mathbf{112}^3$. As shown in FIG. 7B, the global feedback circuit 700 includes a plurality of first diode devices 714, 716, and 718, a storage device that includes a capacitor 720 and a resistor 722, a plurality of elemental NOT gates 724, 726, and 728, and a plurality of second diode devices 730, 732, and 734. The first diode devices 714, 716, and 718 are each coupled to a corresponding one of the plurality of terminals $\mathbf{112}^1$-$\mathbf{112}^3$. The capacitor 720 includes a first terminal coupled to each of the outputs of the plurality of first diode devices 714, 716, and 718 and a second terminal coupled to a voltage supply (e.g., ground). In some implementations, the resistor 722 can be implemented as a parasitic resistance. In FIG. 7B, a storage device that stores charge includes the capacitor 720 and the resistor 722. Any other suitable storage device to store charge can alternatively or additionally be implemented in a global feedback circuit. The elemental NOT gates 724, 726, and 728 are each coupled to the first terminal of the capacitor 720 and the second diode devices 730, 732, and 734 are each coupled between an output of a corresponding one of the plurality of element NOT gates 724, 726, and 728 and a corresponding one of the plurality of terminals $\mathbf{112}^1$-$\mathbf{112}^3$.

The global feedback circuit 700 is configured to function as a feedback system that reinforces the signal pushing terminals above threshold states if all terminals are below the threshold. For example, in the event that the SO-OR gate 120 is in an invalid state but does not have sufficient energy to drive the states of any of the first terminals $\mathbf{112}^1$-$\mathbf{112}^3$ to a valid state (e.g., above the threshold voltage), the global feedback circuit 700 can provide additional energy until the state of at least one of the first terminals $\mathbf{112}^1$-$\mathbf{112}^3$ is changed to a logic 1 state.

The capacitor 720 and the resistor 722 can be configured to provide "memory" effects so as to trigger the reinforcement only if the SOLG is stuck in an invalid state or if the SOLG practically spends too much time in an invalid state. For example, while all three terminals $\mathbf{112}^1$-$\mathbf{112}^3$ are in a false state (e.g., less than the threshold voltage), the capacitor 720 will be charged by the outputs of the elemental NOT gates 724, 726, and 728 providing feedback that drives the three terminals $\mathbf{112}^1$-$\mathbf{112}^3$ to the true state (e.g., higher than the threshold voltage). The charge stored on the capacitor 720 will continue to increase, thereby providing additional energy to the connected SOLGs, until at least one of the three terminals $\mathbf{112}^1$-$\mathbf{112}^3$ reaches the true state. Similar to the dynamic correction circuits 602, 610, and 612, the elemental NOT gates 724, 726, and 728 of the global feedback circuit 700 can be designed to have an output impedance to prevent the incoming signals at the output of the global feedback circuit 700 from generating structural issues. The elemental NOT gates 724, 726, and 728 can also be designed to provide a reinforcement signal strong enough to push at least one of the terminals $\mathbf{112}^1$-$\mathbf{112}^3$ above the predefined threshold. Therefore, according to aspects of this disclosure, the global feedback circuit 700 can reduce and/or eliminate stable invalid states when a large number of SOLGs form a SOC and at the same time the global feedback circuit can improve the ability and speed of the SOC to reach convergence to an equilibrium with only valid states.

Interconnect Systems for SOCs

Embodiments of this disclosure further relate to an interconnect system layout arranged to handle satisfiability problems in conjunctive normal form. For the sake of clarity, an example will be provided for an interconnect system designed to solve 3SAT problems. However, those skilled in the art will recognize that aspects of this disclosure also relate to solving other types of satisfiability problems, and more generally, any type of computational function.

3SAT problems are useful since any SAT problem can be reduced to a 3SAT problem by only doubling the number of variables and literals, in the worst case. However, in principle, the layout discussed here has no limitations on the number of SO-OR terminals, therefore, any n-terminal SO OR gates can be implemented in accordance with any suitable principles and advantages disclosed herein as desired. Modifications to this layout can be used to create layouts for all the other classes of problems requested by this program.

In certain embodiments, a given instance of a satisfiability problem can be provided by connecting SOLGs that share variables. For example, in FIG. 2 the first SO-OR gate 120 has the variable $x_1$ in common with the 3rd, 4th and 5th SO-OR gates 120, so all of the SO-OR gates 120 can all be connected to the bit line of $x_1$. The first and fourth SO-OR gates 120 have an SO-NOT gate interposed between $x_1$ and the first and fourth SO-OR gates 120 since $x_1$ is negated in the respective clause. The first and fourth SO-OR gates 120 can be connected to the bit line of $\overline{x}_1$, where the SO-NOT gate is connected between the bit line of $x_1$ and bit line of $\overline{x}_1$.

Figure 8A:
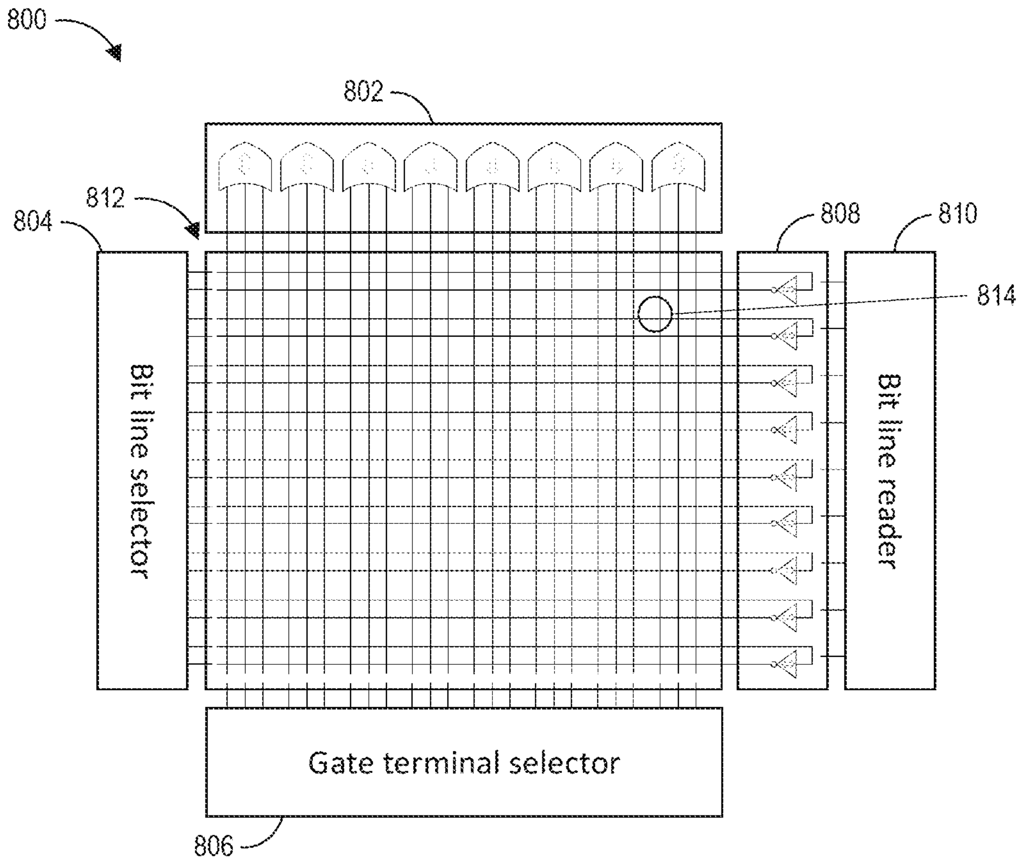
FIG. 8A is a schematic diagram of an example self-organizing logic circuit configured to solve 3SAT problems in accordance with aspects of this disclosure.
Figure 8B:
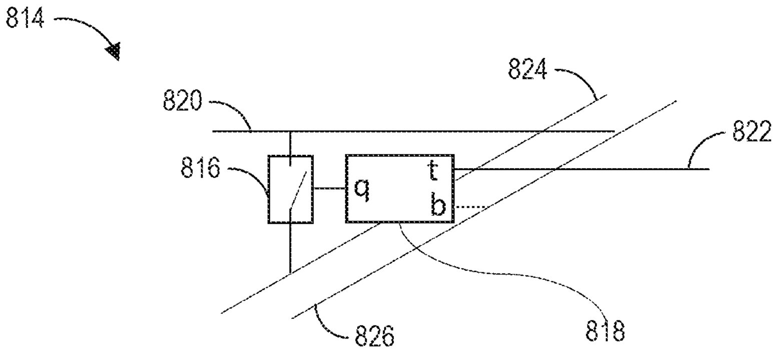
FIG. 8B illustrates an example selector that can be used in the self-organizing logic circuit system.

FIG. 8A is a schematic diagram of an example layout of a self-organizing logic circuit having an interconnect system 800 configured to solve 3SAT problems in accordance with aspects of this disclosure. The interconnect system 800 can electrically connect SOLGs. FIG. 8B illustrates an example selector 814 that can be used in the interconnect system 800. The interconnect system 800 of FIG. 8A includes a bank of SO-OR gates 802, a bit line selector 804, a gate terminal selector 806, a bank of SO-NOT gates 808, a bit line reader 810, a plurality of address lines 812, and a plurality of selectors 814. Although a particular configuration is illustrated in FIG. 8A, other arrangements are also possible. For example, the bank of SO-NOT gates 808 could be arranged adjacent to the bit line selector 804 rather than the bit line reader 810. Together, the bank of SO-OR gates 802 and the bank of SO-NOT gates 808 can form a SOC when connected by the interconnection system 800.

The selector 814 of FIG. 8B includes a switch 816 and a latch 818 which are coupled to corresponding address lines 812. As shown in FIG. 8B, the address lines 812 include a gate terminal line 820, a gate terminal selector line 822, a bit line 824, and a bit selector line 826. The switch 816 may be embodied as a voltage-controlled switch in certain implementations.

The interconnected system 800 of FIGS. 8A and 8B is configured to generate a layout that can be programmed to solve any 3SAT problem with at most nm variables and $n_c$ clauses. Such programming can embed the 3SAT problem in the SOC. The interconnected system 800 can also be reprogramed to solve another 3SAT problem and/or another problem. The embodiment of FIG. 8A employs a relatively low number of gates. However, this design may have certain downsides in that there may be certain circumstance in which a given SO-NOT gate is connected to a relatively large number of SO-OR gates which, to be supported, may be a technological challenge due to local power accumulation related issues.

Certain embodiments can address this technical challenged by having a selector at each SO-OR gate terminal to either bypass or not bypass an SO-NOT gate. In these embodiments, the interconnect system 800 may not include a SO-NOT gate on the bit lines 824. These embodiments may involve the use of additional SO-NOT gates comparted to the interconnect system 800, but can reduce and/or avoid power localization and therefore may be have advantages from a technological point of view.

Referring back to FIGS. 8A and 8B, the interconnect system 800 includes $n_v$ SO-NOT gates connected to the bit lines bank of SO-NOT gates 808 and $n_c$ 3 terminal SO-OR gates connected to the gate terminal selector lines 822 in the bank of SO-OR gates 802. Each SO-NOT gate can be located at the midpoint of two branches of the bit line 824. As used herein, the two branches of the bit line 824 can be referred to as a bit line and a negated bit line based on convention.

The bit lines 824 and gate terminal selector lines 822 can be integrated on two parallel layers so they are not directly coupled. As shown in FIG. 8B, the switch 816 can be configured to connect the corresponding bit line 824 with the corresponding gate terminal selector line 822. This switch 816 can be controlled by the latch 818 which in turn is configured to be programmed or e (e.g., by user input) to implement a 3SAT problem. This programming can embed the problem in SOLGs. This selector 814 enables the interconnect system 800 to connect bit lines 824 with a terminal of an SO-OR gate when the SO-OR gate includes the variable associated with the bit line 824. The latch 818 can be configured to hold the state of the switch 816 after setting the switch 816. The latch 818 can be controlled by the gate terminal selector line 822 and the bit selector lines 826. The selectors 814 can be formed on the same layers of the gate terminals and the bit lines respectively.

The functionality of the latch 818 can be summarized by the following table:

| t | b | q |
|---|---|---|
| 0 | 0 | Hold |
| 0 | 1 | Hold |
| 1 | 0 | 0 (reset) |
| 1 | 1 | 1 (set) |

For example, user input can set a gate terminal selector line 822 (e.g., t) to 1 while all other gate terminal selector lines are set to 0 and at the same time set only the bit selector line 826 of the variable that is desired to associate to the selected terminal to 1 and all the others bit line selector lines to 0. Accordingly, all switches connected to the gate terminal line 822 are set open except the SO-OR gate associated to the variable selected by the programming whose switch 816 is set closed. In this process, the other gate terminal line switches 816 are not changed since their corresponding latch 818 would be in a hold state. The programming can repeat this for each gate terminal line and therefore program the interconnects to create an SOC embedding any satisfiability problem with at most $n_v$ variables and $n_c$ clauses.

Figure 9:
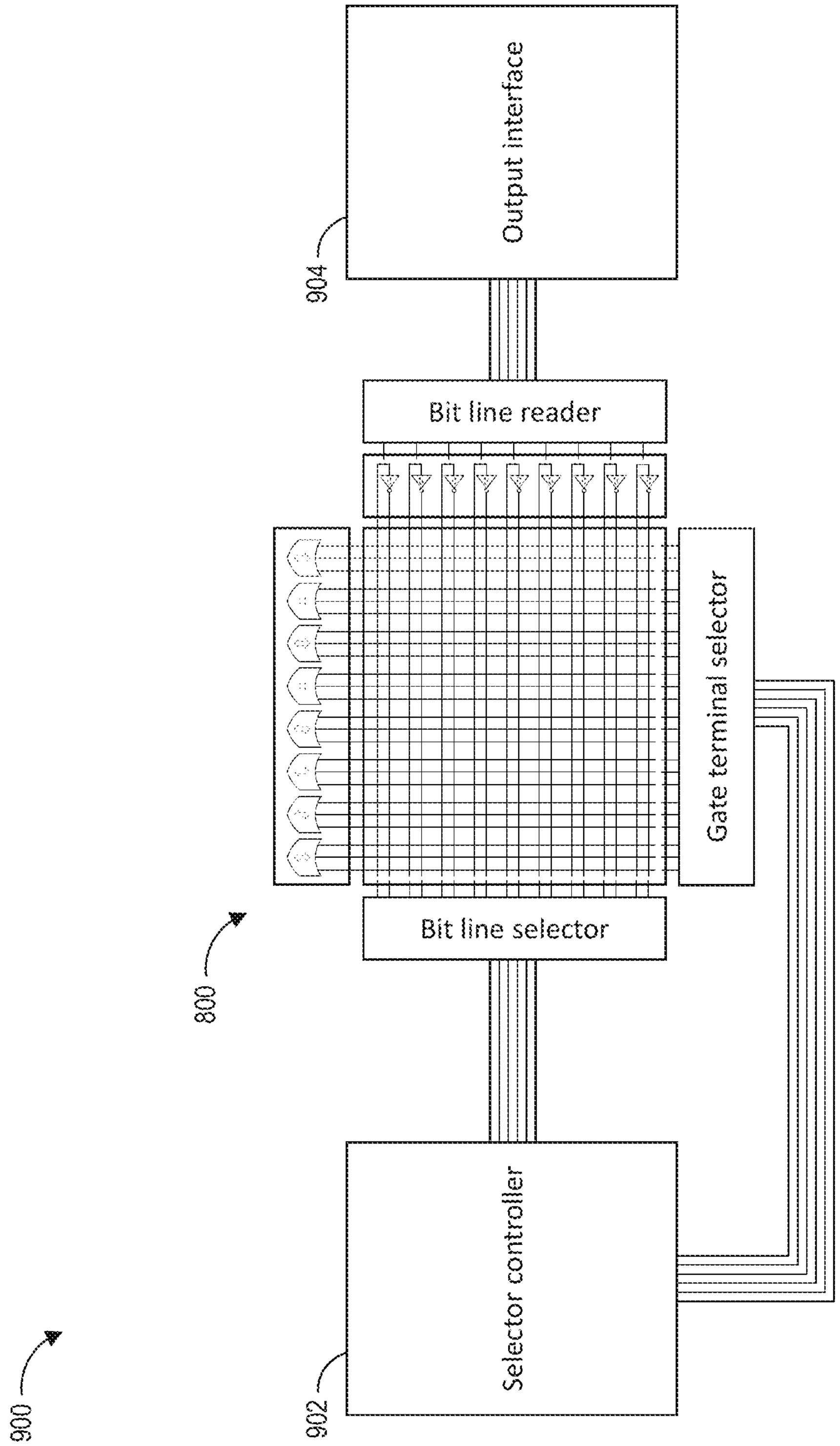
FIG. 9 is a schematic diagram of a self-organizing logic system with an interface which can be used to interface with the self-organizing logic circuit of FIG. 8A.

FIG. 9 is a schematic diagram of a system 900 that includes interfaces for the interconnect system 800 of FIG. 8A. The system 900 includes a selector controller 902 and an output interface 904. The selector controller 902 can configure each of the selectors 814 via the bit line selector 804 and the gate terminal selector 806 to program a SAT problem provided by user input and/or other programming. The output interface 904 is configured to provide the solution to the SAT problem read via the bit line reader 910 after the SOC has reached a stable configuration.

Depending on the implementation, the SOC can include more than thousands of $n_v$ variables, for example. However, other implementations are also possible. In some cases, the number of $n_c$ clauses may be five times that of the number of $n_v$ variables, however, other quantities of $n_c$ clauses are also possible. Advantageously, the clause/variable ratio of 5 to 1 covers a relatively large number of the practical satisfiability problems. Higher ratios are possible, but may limit the number of $n_v$ variables since all SO-OR gates may be used, but some of the bit lines may not be connected to reach the higher clause/variable ratio.

Advantageously, aspects of this disclosure can realize a 50× energy to solution reduction. This is possible because the power absorbed by the SOCs described herein would be comparable to the power absorbed by modern laptop CPUs since the technology (e.g., integrated electronic circuit in MOS technology) is the same. However, the SOCs described herein can provide solutions (e.g., converge to equilibria) in a time measurable by only a few clock cycles. This is a large time savings compared to standard CPUs that involve many-many clock cycles to compute such problems. Further, the number of clock cycles for a standard CPU will grow quickly as the problems scale in each phase. While clock cycles are described here to provide a unit to measure time, the SOCs described herein are asynchronous circuits, and thus, they do not involve the use of an internal clock. When made in MOS technology, the characteristic time of the SOC dynamics are comparable to the clock of a modern CPU (e.g., on the order of nanoseconds).

One issue that may arise in implementing a SOC is the propagation delay of the signal internal to the SOC. This issue may arise due to the reconfigurable interconnect system 800 and since the interconnects are not ideal short circuits, but transmission lines. Propagation delay can affect the ability of the SOC to reach a stable equilibrium and, worst case, introduce spurious oscillation into the dynamics. This issue can be mitigated using various different approaches. However, a propagation delay that is smaller than the characteristic time of the SOC will not introduce issues. Therefore, embodiments of this disclosure can implement an interconnect system with a propagation delay that is within a tolerance (e.g., less than the characteristic time of the SOC). This can be achieved by a) fabrication and material enhancement and/or optimization, and/or by b) placement of the SOLGs and topology of the interconnects to reduce and/or minimize their lengths.

Finally, any integrated circuit (IC) suffers from the variability of its components. This affects almost all design parameters of electronic devices such as channel length, resistivity, transistor threshold and so on. Accordingly, two ideally identical transistors in the same IC may have a different actual current/potential relation. And the more miniaturized the IC is, the worse the variability can get and the fabrication processes can become more expensive to limit this. For a pure digital circuit, only some are relevant while others are relevant for an analog circuit. Therefore, variability can be an issue especially for very large scale integration (VLSI).

For the SOCs described herein, variability can be a relevant issue since the SOC may be implemented as a VLSI transistor-based analog circuit. Thus, it can be significant that both static and dynamic circuit parameters are predictable within a tolerance. There are approaches that can be used to mitigate and overcame these problems. Some of the design parameters can have a relatively large tolerance due to the topological robustness of SOCs. However, it can be significant to control other design parameters since the parameters can introduce unwanted equilibria into the dynamics. When simple design and variability control are insufficient to guarantee the correct behavior, a redundancy approach can be employed where SOLGs and/or internal parts thereof are replicated such that the natural averaging introduced by the redundancy can compensate variability.

Although embodiments disclosed herein can be implemented as an application specific integrated circuit, a circuit emulator can emulate the functionality of SOCs disclosed herein. The emulator can be implemented by instructions stored on a computer readable medium that cases one or more processors to emulate SOCs disclosed herein. The emulator can solve complex problems using SOCs.

CONCLUSION

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments. It is to be understood that the forms of disclosure herein shown and described are to be taken as representative embodiments. Equivalent elements, materials, processes or steps may be substituted for those representatively illustrated and described herein. Moreover, certain features of the disclosure may be utilized independently of the use of other features, all as would be apparent to one skilled in the art after having the benefit of this description of the disclosure. Expressions such as "including," "comprising," "incorporating," "consisting of," "have," "is" used to describe and claim the present disclosure are intended to be construed in a non-exclusive manner, namely allowing for items, components or elements not explicitly described also to be present. Reference to the singular is also to be construed to relate to the plural.

Further, various embodiments disclosed herein are to be taken in the illustrative and explanatory sense, and should in no way be construed as limiting of the present disclosure. All joinder references (e.g., attached, affixed, coupled, connected, and the like) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other. Additionally, all numerical terms, such as, but not limited to, "first", "second", "third", "primary", "secondary", "main" or any other ordinary and/or numerical terms, should also be taken only as identifiers, to assist the reader's understanding of the various elements, embodiments, variations and/or modifications of the present disclosure, and may not create any limitations, particularly as to the order, or preference, of any element, embodiment, variation and/or modification relative to, or over, another element, embodiment, variation and/or modification.

It will also be appreciated that one or more of the elements depicted in the drawings/figures can also be implemented in a more separated or integrated manner, or even removed or rendered as inoperable in certain cases, as is useful in accordance with a particular application.

What is claimed is:

1. A self-organizing logic circuit, comprising:

a plurality of self-organizing logic gates;

at least one control circuit configured to selectively connect the self-organizing logic gates to embed a problem in the self-organizing logic gates, the at least one control circuit comprising:

a plurality of address lines;

a bit line selector; and a gate terminal selector, wherein the bit line selector and the gate terminal selector are configured to electrically connect the self-organizing logic gates via the address lines to embed the problem in the self-organizing logic gates; and an output circuit configured to read a solution to the problem from the self-organizing logic gates.

2. The self-organizing logic circuit of claim 1, wherein the at least one control circuit further comprises:

a plurality of selectors, each of the selectors comprising:

a switch configured to connect a terminal of a corresponding one of the self-organizing logic gates to one of the address lines representing a variable of the problem, and a latch configured to control the switch.

3. The self-organizing logic circuit of claim 1, wherein the self-organizing logic gates comprise:

a plurality of self-organizing OR gates, and a plurality of self-organizing NOT gates.

4. The self-organizing logic circuit of claim 1, wherein the problem is a satisfiability problem.

5. The self-organizing logic circuit of claim 1, wherein the self-organizing logic circuit is embodied on a single integrated circuit.

6. The self-organizing logic circuit of claim 1, wherein the self-organizing logic gates consist of metal oxide semiconductor circuit elements.

7. A method of solving a satisfiability problem using the self-organizing logic circuit of claim 1, the method comprising:

embedding the satisfiability problem in the plurality of self-organizing logic gates by selectively connecting the self-organizing logic gates using the at least one control circuit; and reading a solution to the satisfiability problem from the self-organizing logic gates using the output circuit once the self-organizing logic gates have reached an equilibrium.

8. The method of claim 7, wherein the plurality of self-organizing logic gates include a plurality of self-organizing OR gates and a plurality of self-organizing NOT gates.

9. The method of claim 7, further comprising:

embedding an other problem in at least some of the plurality of self-organizing logic gates using the at least one control circuit; and reading a solution to the other problem from the self-organizing logic gates using the at least one control circuit.

10. The self-organizing logic circuit of claim 1, wherein each of the self-organizing logic gates comprises:

a plurality of physical terminals, and a plurality dynamic correction circuits, each of the dynamic correction circuits configured to drive a state of one of the physical terminals based on a state of one or more other ones of the physical terminals, wherein the plurality of dynamic correction circuits of a particular self-organizing logic gate of the self-organizing logic gates are configured to implement a logical OR operation of the particular self-organizing logic gate such that at least one of the plurality of physical terminals of the particular self-organizing logic gate has a logic 1 state.

11. A self-organizing logic circuit, comprising:

a plurality of self-organizing logic gates, wherein each of the self-organizing logic gates comprises:

a plurality of physical terminals, and a plurality dynamic correction circuits, each of the dynamic correction circuits configured to drive a state of one of the physical terminals based on a state of one or more other ones of the physical terminals, and each of the dynamic correction circuits comprising a diode device and one or more elemental logic gates;

at least one control circuit configured to selectively connect the self-organizing logic gates to embed a problem in the self-organizing logic gates; and an output circuit configured to read a solution to the problem from the self-organizing logic gates.

12. The self-organizing logic circuit of claim 11, wherein the plurality of dynamic correction circuits of a particular self-organizing logic gate of the self-organizing logic gates are configured to implement a logical OR operation of the particular self-organizing logic gate such that at least one of the plurality of physical terminals of the particular self-organizing logic gate has a logic 1 state.

13. The self-organizing logic circuit of claim 11, wherein the at least one control circuit comprises:

a plurality of address lines;

a bit line selector; and a gate terminal selector, wherein the bit line selector and the gate terminal selector are configured to electrically connect the self-organizing logic gates via the address lines to embed the problem in the self-organizing logic gates.

14. A self-organizing logic gate, comprising:

a plurality of physical terminals; and a plurality dynamic correction circuits, each of the dynamic correction circuits configured to drive a state of one of the plurality of physical terminals based on states of the remaining one or more physical terminals of the plurality of physical terminals, each of the dynamic correction circuits comprising a diode device and one or more elemental logic gates, wherein the plurality of dynamic correction circuits are configured to implement a logical OR operation of the self-organizing logic gate such that at least one of the plurality of physical terminals has a logic 1 state.

15. The self-organizing logic gate of claim 14, wherein the one or more elemental logic gates comprise:

an elemental OR gate including:

input terminals connected to each of the physical terminals other than the one of the physical terminals, and an output terminal connected to the one of the physical terminals, and an elemental NOT gate including:

an input terminal coupled to the output terminal of the elemental OR gate, and an output terminal coupled to the diode device.

16. The self-organizing logic gate of claim 14, wherein the one or more elemental logic gates are configured to implement a NOR logic function such that an input signal to the diode device satisfies a NOR logic relationship with signals at each of the physical terminals other than the one of the physical terminals.

17. The self-organizing logic gate of claim 14, wherein the self-organizing logic gate consists of metal oxide semiconductor circuit elements.

18. A self-organizing logic gate, comprising:

a plurality of physical terminals;

a plurality dynamic correction circuits, each of the dynamic correction circuits configured to drive a state of one of the plurality of physical terminals based on states of the remaining one or more physical terminals of the plurality of physical terminals; and a global feedback circuit configured to provide additional electrical energy to the plurality of physical terminals when the self-organizing logic gate is in an invalid state, wherein the plurality of dynamic correction circuits are configured to implement a logical OR operation of the self-organizing logic gate such that at least one of the plurality of physical terminals has a logic 1 state.

19. The self-organizing logic gate of claim 18, wherein the global feedback circuit comprises:

a plurality of first diode devices, each of which includes an input coupled to a corresponding one of the plurality of physical terminals and an output, a capacitor including a first terminal coupled to each of the outputs of the plurality of first diode devices and a second terminal coupled to a voltage supply, a plurality of elemental NOT gates, each of which includes an input coupled to the first terminal of the capacitor and an output, and a plurality of second diode devices, each of which includes an input coupled to an output of a corresponding one of the plurality of element NOT gates and an output coupled to corresponding one of the plurality of physical terminals.

20. The self-organizing logic gate of claim 18, further comprising a global feedback circuit configured to provide additional electrical energy to the plurality of physical terminals when the self-organizing logic gate is in an invalid state.

* * * * *